United States Patent
Mao

(10) Patent No.: US 10,431,758 B2
(45) Date of Patent: Oct. 1, 2019

(54) THIN FILM TRANSISTOR, DISPLAY PANEL AND DISPLAY APPARATUS HAVING THE SAME, AND FABRICATING METHOD THEREOF

(71) Applicant: BOE TECHNOLOGY GROUP CO., LTD., Beijing (CN)

(72) Inventor: Defeng Mao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 99 days.

(21) Appl. No.: 15/565,357

(22) PCT Filed: Oct. 10, 2016

(86) PCT No.: PCT/CN2016/101617
§ 371 (c)(1),
(2) Date: Oct. 9, 2017

(87) PCT Pub. No.: WO2018/068170
PCT Pub. Date: Apr. 19, 2018

(65) Prior Publication Data
US 2018/0309074 A1    Oct. 25, 2018

(51) Int. Cl.
*H01L 51/05* (2006.01)
*H01L 29/786* (2006.01)
(Continued)

(52) U.S. Cl.
CPC ............ *H01L 51/0566* (2013.01); *G03F 7/16* (2013.01); *G03F 7/20* (2013.01); *G03F 7/26* (2013.01);
(Continued)

(58) Field of Classification Search
None
See application file for complete search history.

(56) References Cited

U.S. PATENT DOCUMENTS

2004/0241900 A1    12/2004    Tsukamoto et al.
2007/0278481 A1    12/2007    Lee et al.
(Continued)

FOREIGN PATENT DOCUMENTS

| CN | 1558932 A | 12/2004 |
|----|-----------|---------|
| CN | 102610754 A | 7/2012 |

(Continued)

OTHER PUBLICATIONS

International Search Report & Written Opinion dated Jun. 30, 2017, regarding PCT/CN2016/101617.

*Primary Examiner* — Thien F Tran
(74) *Attorney, Agent, or Firm* — Intellectual Valley Law, P.C.

(57) ABSTRACT

The present application discloses a thin film transistor, a display panel and a display apparatus having the same, and a fabricating method thereof. The thin film transistor includes a base substrate and an active layer on the base substrate having a first portion corresponding to a channel region, a second portion corresponding to a source electrode contact region, and a third portion corresponding to a drain electrode contact region, wherein the second portion and the third portion contain a polymer carbon nanotubes composite including a polymer and a carbon nanotubes material.

9 Claims, 4 Drawing Sheets

(51) Int. Cl.
 *H01L 51/00* (2006.01)
 *G03F 7/16* (2006.01)
 *G03F 7/20* (2006.01)
 *G03F 7/26* (2006.01)
 *H01L 51/10* (2006.01)

(52) U.S. Cl.
 CPC ........ *H01L 29/786* (2013.01); *H01L 51/0035* (2013.01); *H01L 51/0037* (2013.01); *H01L 51/0041* (2013.01); *H01L 51/0048* (2013.01); *H01L 51/105* (2013.01); *H01L 51/0016* (2013.01); *H01L 51/0018* (2013.01); *H01L 51/0545* (2013.01)

(56) References Cited

U.S. PATENT DOCUMENTS

| | | |
|---|---|---|
| 2008/0224128 A1 | 9/2008 | Kim et al. |
| 2010/0133516 A1 | 6/2010 | Lee et al. |
| 2010/0224862 A1 | 9/2010 | Endoh et al. |
| 2011/0147719 A1* | 6/2011 | Hsu ........................ H01B 1/127 257/40 |
| 2012/0187380 A1 | 7/2012 | Wu |

FOREIGN PATENT DOCUMENTS

| | | |
|---|---|---|
| CN | 102856211 A | 1/2013 |
| JP | 2007077258 A | 3/2007 |

\* cited by examiner

THIN FILM TRANSISTOR, DISPLAY PANEL AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/101617, filed Oct. 10, 2016, the contents of which are incorporated by reference in the entirety.

TECHNICAL FIELD

The present invention relates to a thin film transistor, a display panel and a display apparatus having the same, and a fabricating method thereof.

BACKGROUND

Carbon nanotubes materials have become a focus of research and development in recent years. Carbon nanotubes materials have the characteristics of low cost, excellent mechanical properties, and corrosion resistance. Due to these characteristics, they have been considered as a good candidate semiconductor material for next generation electronic devices.

SUMMARY

In one aspect, the present invention provides a thin film transistor comprising a base substrate and an active layer on the base substrate having a first portion corresponding to a channel region, a second portion corresponding to a source electrode contact region, and a third portion corresponding to a drain electrode contact region, wherein the second portion and the third portion comprise a polymer carbon nanotubes composite including a polymer and a carbon nanotubes material.

Optionally, the polymer is a conductive polymer.

Optionally, the thin film transistor further comprises a source electrode in the source electrode contact region in direct contact with the second portion; and a drain electrode in the drain electrode contact region in direct contact with the third portion.

Optionally, the first portion is a carbon nanotubes layer.

Optionally, the carbon nanotubes layer consists essentially of a semiconducting carbon nanotubes material.

Optionally, the polymer carbon nanotubes composite comprises a carbon nanotubes layer coated with the polymer.

Optionally, the carbon nanotubes material is a single-walled carbon nanotubes material substantially free of amorphous carbon.

Optionally, the polymer is selected from the group consisting of polyaniline (PANI), poly(3,4-ethylenedioxythixythiphene) (PSS), poly(3,4-ethylenedioxythiophene) polystyrene sulfonate (PEDOT:PSS), polyacetylene, polypyrroles, polyacetylene-polypyrrole, and any derivative and combination thereof.

Optionally, the thin film transistor further comprises a gate electrode layer, and a gate insulating layer between the active layer and the gate electrode layer.

In another aspect, the present invention provides a method of fabricating an active layer of a thin film transistor having a first portion corresponding to a channel region, a second portion corresponding to a source electrode contact region, and a third portion corresponding to a drain electrode contact region, comprising forming the second portion and the third portion using a polymer carbon nanotubes composite including a polymer and a carbon nanotubes material.

Optionally, the step of forming the second portion and the third portion comprises forming a carbon nanotubes layer in the source electrode contact region and the drain electrode contact region on a base substrate; and coating the carbon nanotubes layer in the source electrode contact region and the drain electrode contact region with a polymer material thereby forming the second portion and the third portion comprising a polymer carbon nanotubes composite.

Optionally, the method comprises forming a carbon nanotubes layer in the channel region, the source electrode contact region, and the drain electrode contact region on the base substrate; coating the carbon nanotubes layer in the channel region, the source electrode contact region, and the drain electrode contact region with a polymer material thereby forming a polymer carbon nanotubes composite layer; and removing the polymer material in the channel region.

Optionally, the step of removing the polymer material in the channel region comprises forming a photoresist layer on a side of the polymer carbon nanotubes composite layer distal to the base substrate; exposing the photoresist layer with a mask plate, and developing the exposed photoresist layer to obtain a photoresist pattern having a first section corresponding to the channel region, and a second section corresponding to the source electrode contact region and the drain electrode contact region; the photoresist layer being removed in the first section; and removing the polymer material in the channel region thereby forming the first portion.

Optionally, prior to the step of coating and subsequent to the step of forming the carbon nanotubes layer, the method further comprises forming a photoresist layer in the channel region; and subsequent to the step of coating, the method further comprises removing the photoresist layer and the polymer material in the channel region by a lift-off method using a lift-off solvent.

Optionally, the step of coating comprises coating the carbon nanotubes layer in the source electrode contact region and the drain electrode contact region with a polymer ink.

Optionally, the step of coating comprises coating the carbon nanotubes layer in the source electrode contact region and the drain electrode contact region with a melted polymer material.

In another aspect, the present invention provides a method of fabricating a thin film transistor comprising: forming the active layer according to a method of fabricating an active layer of a thin film transistor described herein; forming a source electrode in the source electrode contact region in direct contact with the second portion; and forming a drain electrode in the drain electrode contact region in direct contact with the third portion.

In another aspect, the present invention provides a thin film transistor fabricated by a method described herein.

In another aspect, the present invention provides a display panel comprising a thin film transistor described herein or fabricated by a method described herein.

In another aspect, the present invention provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In a conventional thin film transistor having carbon nanotubes as a component, contact resistance at contact regions between the carbon nanotubes and electrodes is typically very large. Various methods have been proposed to lower the contact resistance of the carbon nanotubes. For example, attempts to lower the contact resistance have been tried by sputtering various metal material on the contact region. However, these conventional methods may not always achieve good ohmic contact at the contact region. Moreover, sputtering metal material may introduce defects in the carbon nanotubes structure and deteriorate its intrinsic thermal and electrical properties.

Accordingly, the present invention provides, inter alia, a thin film transistor, a display panel and a display apparatus having the same, and a fabricating method thereof that substantially obviate one or more of the problems due to limitations and disadvantages of the related art. In one aspect, the present disclosure provides a thin film transistor having a base substrate and an active layer on the base substrate having a first portion corresponding to a channel region, a second portion corresponding to a source electrode contact region, and a third portion corresponding to a drain electrode contact region. The second portion and the third portion includes a polymer carbon nanotubes composite including a polymer material and a carbon nanotubes material.

As used herein, the term "polymer carbon nanotubes composite" refers to a material composed of at least a polymer material and a carbon nanotubes material. Optionally, the polymer material and the carbon nanotubes material remain distinct at the macroscopic or microscopic scale in the composite. Optionally, the composite is a nanocomposite.

Carbon nanotubes can be classified into metallic and semiconducting types based on different electronic properties. As used herein, the term "carbon nanotubes" in the context of the present disclosure refers to semiconducting carbon nanotubes. Optionally, the carbon nanotubes may be any of a number of cylindrically-shaped allotropes of carbon of the fullerene family including single-walled carbon nanotubes (SWNTs), double-walled carbon nanotubes (DWNTs), multi-walled carbon nanotubes (MWNTs), any derivatized forms thereof such as nanofibers, and any combination thereof. Optionally, the carbon nanotubes have a diameter in a range of approximately 3 Å to approximately 100 nm, e.g., approximately 3 Å to approximately 10 nm.

Figure 1:
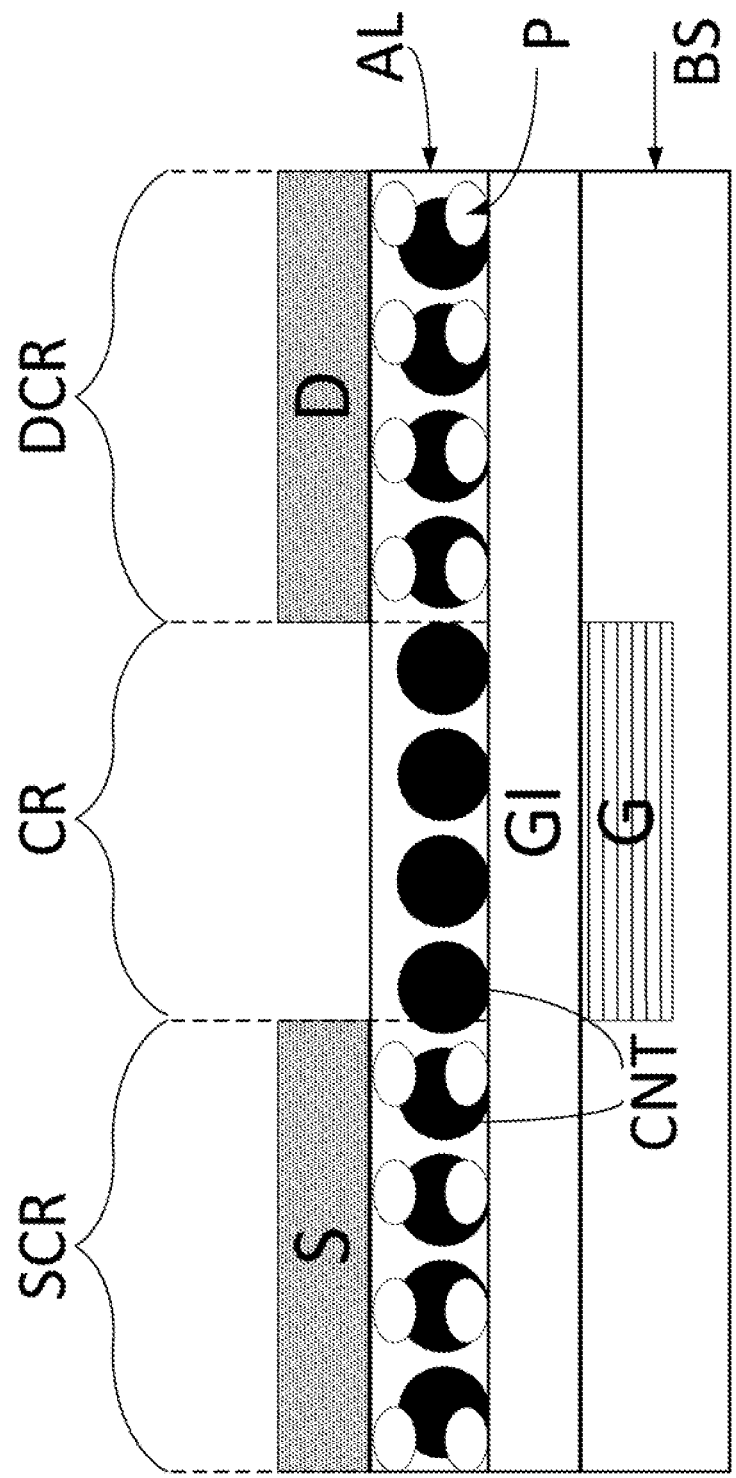
FIG. 1 is a diagram illustrating the structure of a thin film transistor in some embodiments according to the present disclosure.

FIG. 1 is a diagram illustrating the structure of a thin film transistor in some embodiments according to the present disclosure. Referring to FIG. 1, the thin film transistor in the embodiment includes a base substrate BS and an active layer AL on the base substrate BS. The active layer AL includes a first portion corresponding to a channel region CR, a second portion corresponding to a source electrode contact region SCR, and a third portion corresponding to a drain electrode contact region DCR. The second portion and the third portion is a polymer carbon nanotubes composite layer including a polymer material P and a carbon nanotubes material CNT.

The polymer carbon nanotubes composite may have various appropriate polymer to CNT ratios. In some embodiments, the polymer carbon nanotubes composite has a polymer to CNT ratio in a range of approximately 1.52:1 by weight to approximately 1:1 by weight, e.g., approximately 1.385:1 by weight, approximately 1.25:1 by weight, approximately 1.1:1 by weight.

In some embodiments, the polymer material in the polymer carbon nanotubes composite layer is a conductive polymer material. Examples of appropriate conductive polymer materials include, but are not limited to, polyaniline (PANI), poly(3,4-ethylenedioxythiophene) (PSS), poly(3,4-ethylenedioxythiophene) polystyrene sulfonate (PEDOT:PSS), polyacetylene, polypyrroles, polyacetylene-polypyrrole, polythiophene such as poly-ethylene dioxythiophene (PEDOT), poly(p-phenylene), poly(triphenylene), polyazulene, polyfluorene, polynaphtalene, polyanthracene, polyfuran, polycarbazole, tetrathiafulvalene-substituted polystyrene, ferrocene-substituted polyethylene, carbazole-substituted polyethylene, polyoxyphenazine, polyacenes, poly(heteroacenes), polysilane, and any derivative and combination thereof.

Optionally, the polymer material is selected from the group consisting of polyaniline (PANI), poly(3,4-ethylenedioxythiophene) (PSS), poly(3,4-ethylenedioxythiophene) polystyrene sulfonate (PEDOT:PSS), polyacetylene, polypyrroles, polyacetylene-polypyrrole, and any derivative and combination thereof.

Optionally, the carbon nanotubes material is a single-walled carbon nanotubes material. Optionally, the carbon nanotubes material is a double-walled carbon nanotubes material. Optionally, the carbon nanotubes material is a multi-walled carbon nanotubes material. Optionally, the carbon nanotubes material is a heteroatom-doped carbon nanotubes material. Examples of heteroatom-doped carbon nanotubes materials include, but are not limited to, a boron-doped carbon nanotubes material, a nitrogen-doped carbon nanotubes material, an oxygen-doped carbon nanotubes material, a hydrogen-doped carbon nanotubes material, and any combination thereof.

In some embodiments, the polymer material in the polymer carbon nanotubes composite is coated on the carbon nanotubes material so that the surface of the carbon nanotubes material is modified to achieve advantageous properties. For example, the polymer material may modify the carbon nanotubes material so that a surface resistance of the carbon nanotubes material is significantly reduced. When a source electrode and a drain electrode are formed on the second portion and the third portion, respectively, an ohmic contact is achieved between the active layer and the source and drain electrodes. Thus, the present thin film transistor obviates the need of an ohmic contact layer between the active layer and the source and drain electrodes.

Accordingly, in some embodiments, the thin film transistor further includes a source electrode in the source electrode contact region in direct contact with the second portion; and a drain electrode in the drain electrode contact region in direct contact with the third portion. Referring to FIG. 1, the source electrode S is on a side of the second portion distal to the base substrate BS, and the drain electrode D is on a side of the third portion distal to the base substrate BS. At least a portion of the second portion includes the polymer carbon nanotubes composite. At least a portion of the third portion includes the polymer carbon nanotubes composite. Optionally, the entire second portion includes the polymer carbon nanotubes composite. Optionally, the entire third portion includes the polymer carbon nanotubes composite.

Optionally, the thin film transistor further includes an ohmic contact layer between the second portion and the source electrode. Optionally, the thin film transistor further includes an ohmic contact layer between the third portion and the drain electrode.

Optionally, the polymer carbon nanotubes composite layer includes at least two polymers different from each other. Optionally, the carbon nanotubes material is coated with at least two different polymers.

Optionally, the polymer carbon nanotubes composite layer is formed by coating a polymer material on a carbon nanotubes layer. Optionally, the polymer material includes a polymer solution such as a polymer ink or a melted polymer material. Optionally, the polymer carbon nanotubes composite layer is formed by coating a polymerizable monomer material on a carbon nanotubes layer, and polymerizing the monomer material on the carbon nanotubes layer in situ.

Optionally, the polymer material may be non-covalently wrapped around the carbon nanotubes material. Optionally, the polymer material may be covalently attached to the carbon nanotubes material. Optionally, the polymer material may be attached to the carbon nanotubes material by other interactions such as π-π interaction when the polymer has an aromatic functional group.

Optionally, the polymer carbon nanotubes composite includes a matrix constituent which provides the composite with cohesion, and a reinforcer constituent which provides the composite with electrical, mechanical, and/or physical advantageous properties. Optionally, the carbon nanotubes material is the matrix constituent and the polymer material is the reinforcer constituent. Optionally, the polymer material is dispersed in a carbon nanotubes matrix. Optionally, the polymer material is the matrix constituent and the carbon nanotubes material is the reinforcer constituent 1. Optionally, the carbon nanotubes material is dispersed in the polymer matrix. Optionally, the polymer material modifies the surface of a carbon nanotubes layer for providing a lower contact resistance.

Referring to FIG. 1, the active layer AL further includes a first portion corresponding to the channel region CR. Optionally, the first portion is a carbon nanotubes layer. Optionally, the carbon nanotubes layer consists essentially of the carbon nanotubes material, e.g., the first portion is substantially free of the polymer material. Optionally, the carbon nanotubes layer consists essentially of a semiconducting carbon nanotubes material. Optionally, the carbon nanotubes layer includes less than approximately 2% by weight of the polymer material.

Optionally, the first portion may be doped with a dopant, e.g., for enhancing carrier mobility and reducing leak current. The dopant is a material different from the polymer material in the second portion and the third portion.

In some embodiments, the thin film transistor further includes a gate electrode layer, and a gate insulating layer between the active layer and the gate electrode layer. The thin film transistor may be a top-gate type thin film transistor. Optionally, the thin film transistor is a bottom-gate type thin film transistor. FIG. 1 illustrates the structure of a bottom-gate type thin film transistor. Referring to FIG. 1, the thin film transistor includes a gate electrode G on the base substrate BS; a gate insulating layer GI on a side of the gate electrode G distal to the base substrate BS; an active layer AL on a side of the gate insulating layer GI distal to the gate electrode G; and a source electrode and a drain electrode on a side of the active layer AL distal to the gate insulating layer GI.

Optionally, the thin film transistor is a top-gate type thin film transistor. Optionally, the thin film transistor includes an active layer on a base substrate; a source electrode and a drain electrode on a side of the active layer distal to the base substrate; a gate insulating layer on a side of the source electrode, the drain electrode, and the active layer, distal to the base substrate; and a gate electrode on a side of the gate insulating layer distal to the active layer.

In another aspect, the present disclosure provides a method of fabricating an active layer of a thin film transistor having a first portion corresponding to a channel region, a second portion corresponding to a source electrode contact region, and a third portion corresponding to a drain electrode contact region. In some embodiments, the method includes forming the second portion and the third portion using a polymer carbon nanotubes composite including a polymer material and a carbon nanotubes material. Specifically, the method in some embodiments includes forming a carbon nanotubes layer in the source electrode contact region and the drain electrode contact region on a base substrate; and coating the carbon nanotubes layer in the source electrode contact region and the drain electrode contact region with the polymer material thereby forming the second portion and the third portion having a polymer carbon nanotubes composite.

Various appropriate methods may be used for making the present thin film transistor. For example, the polymer material may be directly coated on the carbon nanotubes layer in the source electrode contact region and the drain electrode contact region with a mask plate having a pattern corresponding to the second portion and the third portion. For example, the mask plate may include a first section corresponding to the second portion and third portion of the active layer, and a second section corresponding to the rest of the base substrate. The polymer material may be coated on the carbon nanotubes layer, e.g., by spin coating.

In some embodiments, the method includes forming a carbon nanotubes layer in the channel region, the source electrode contact region, and the drain electrode contact region on the base substrate; coating the carbon nanotubes layer in the channel region, the source electrode contact region, and the drain electrode contact region with the polymer material thereby forming a polymer carbon nanotubes composite layer; and removing the polymer material in the channel region.

Figure 2A:
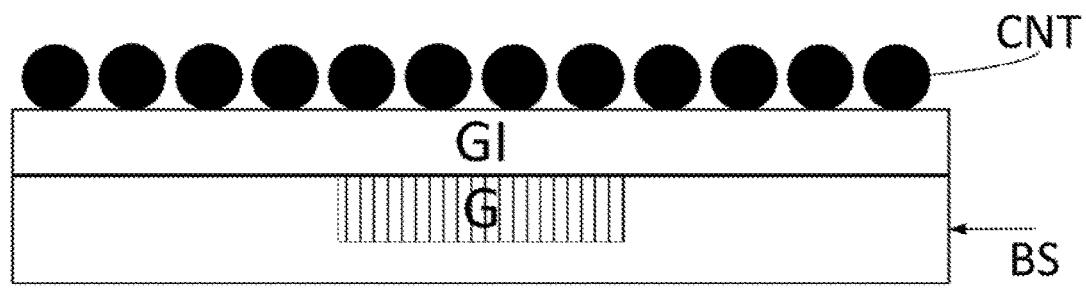
FIGS. 2A-2G illustrate a process of fabricating a thin film transistor in some embodiments according to the present disclosure.
Figure 2B:
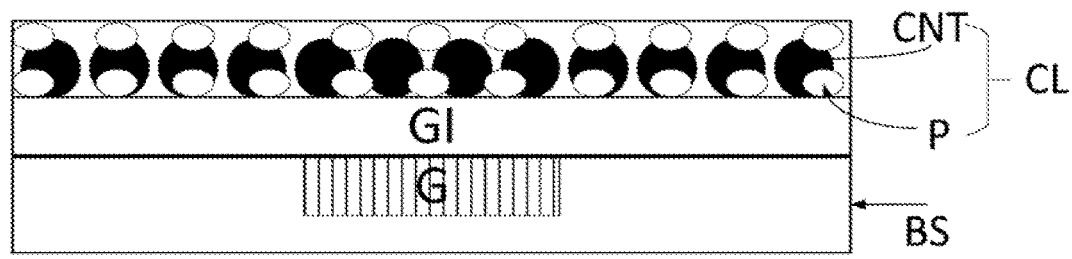

Various appropriate methods may be used for removing the polymer material in the channel region. For example, the polymer material in the channel region may be removed by a patterning process. FIGS. 2A-2G illustrate a process of fabricating a thin film transistor in some embodiments according to the present disclosure. Referring to FIG. 2A, a carbon nanotubes layer including a carbon nanotube material CNT is formed on a base substrate BS in an area corresponding to the active layer. Subsequently, as shown in FIG. 2B, the carbon nanotubes material CNT is coated with a polymer material P. The polymer material P and the carbon nanotubes material CNT form a polymer carbon nanotubes composite layer CL. The polymer material P may be coated using various appropriate methods. Optionally, the polymer material P is spin coated on the carbon nanotubes material CNT. Optionally, the carbon nanotubes material CNT is coated with a polymer solution having the polymer material P, e.g., a polymer ink. Optionally, the carbon nanotubes material CNT is coated with a melted polymer material P.

Figure 2C:
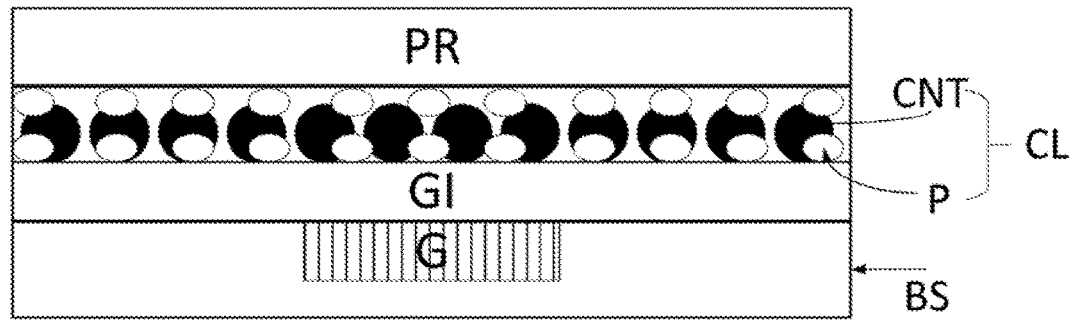
Figure 2D:
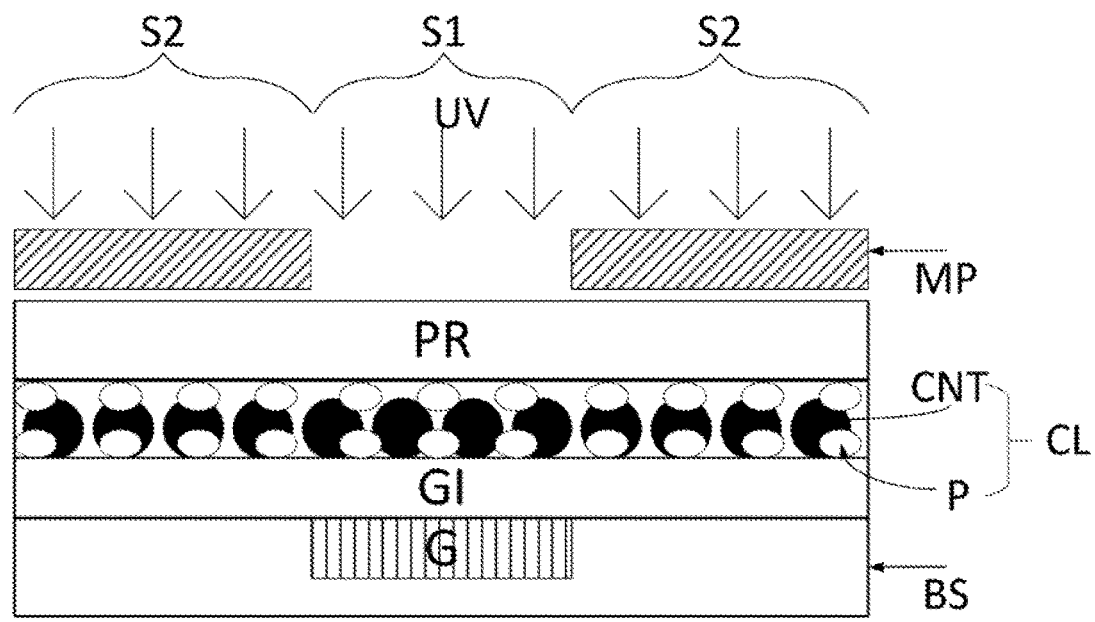

Referring to FIG. 2C, the method in the embodiment further includes forming a photoresist layer PR on a side of the polymer carbon nanotubes composite layer CL distal to the base substrate BS. The photoresist layer PR is then exposed under UV light with a mask plate MP (FIG. 2D). The exposed photoresist layer PR is developed to obtain a photoresist pattern having a first section S1 corresponding to the channel region, and a second section S2 corresponding to the source electrode contact region and the drain electrode contact region. As shown in FIG. 2D, the photoresist material is removed in the first section S1, thereby exposing the polymer carbon nanotubes composite layer CL in the first section S1.

Figure 2E:
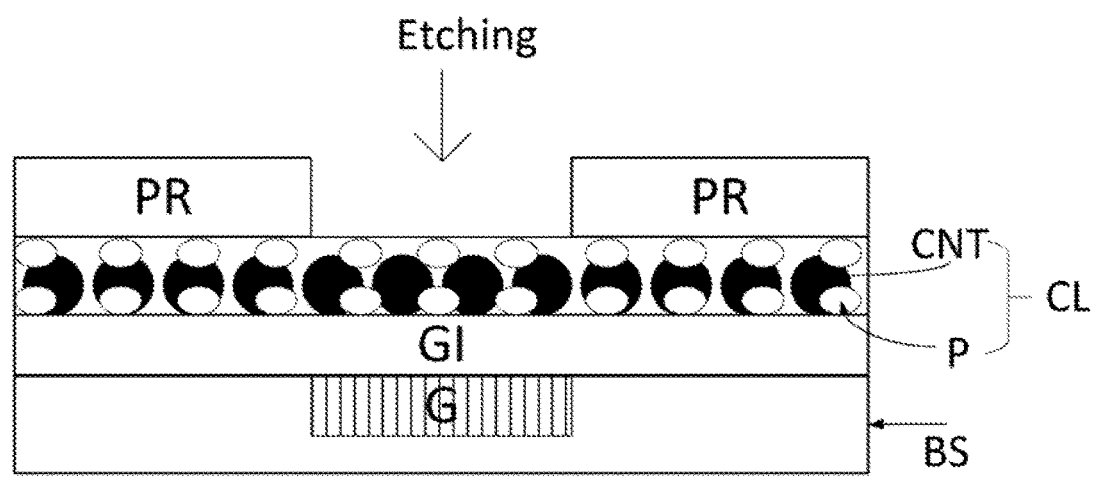

Referring to FIG. 2E, the polymer material P in the first section S1 is removed by etching, e.g., wet etching or dry etching. An etchant may be selected so that the selected etchant selectively etches the polymer material P in the first section S1, e.g., only etches the polymer material P but does not etch the carbon nanotubes material CNT in the first section S1. The selectivity may be adjusted by, e.g., the etchant concentration, the etching duration, and the etching temperature. An acidic etchant may be used for etching an alkaline polymer material. Similarly, an alkaline etchant may be used for etching an acidic polymer material. Optionally, the polymer material P in the first section S1 may be removed by electron beam bombardment.

Figure 2F:
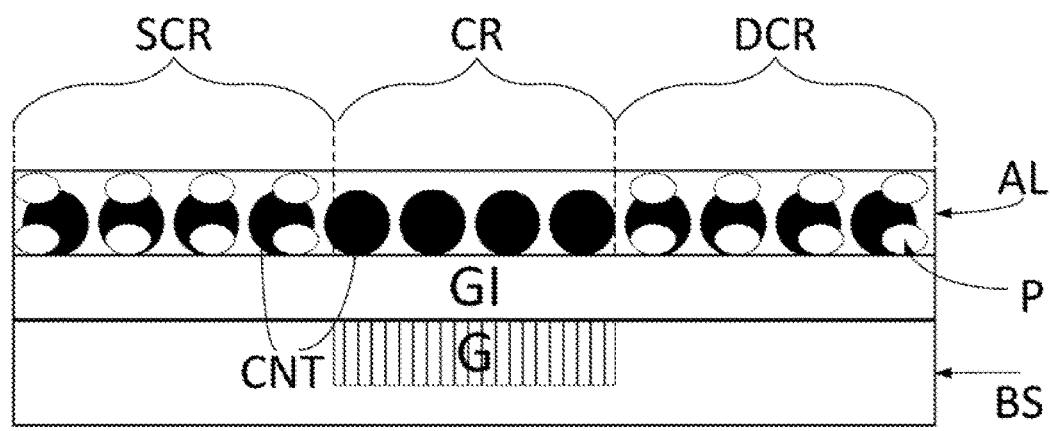

Referring to FIG. 2F, once the polymer material P in the first section S1 is removed, the photoresist material PR in the second section S2 is then removed, thereby forming the active layer AL having a first portion corresponding to a channel region CR, a second portion corresponding to a source electrode contact region SCR, and a third portion corresponding to a drain electrode contact region DCR.

Figure 2G:
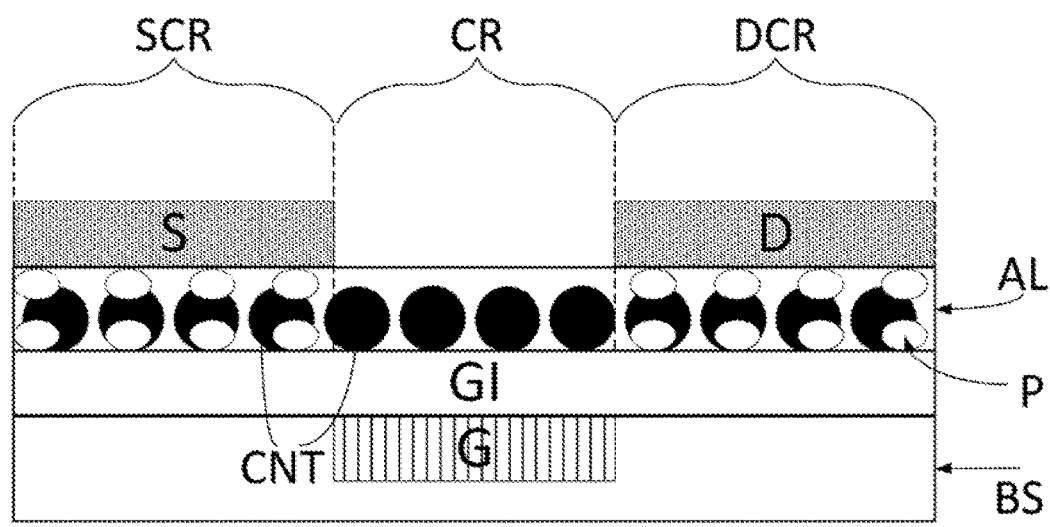

Referring to FIG. 2G, the method in the embodiment further includes forming a source electrode in the source electrode contact region; and forming a drain electrode in the drain electrode contact region. Optionally, the method includes forming a source electrode in the source electrode contact region in direct contact with the second portion; and forming a drain electrode in the drain electrode contact region in direct contact with the third portion.

In some embodiments, the active layer may be fabricated by a lift-off method. Optionally, the method includes forming a carbon nanotubes layer in the channel region, the source electrode contact region, and the drain electrode contact region on the base substrate; forming a photoresist layer in the channel region; coating the carbon nanotubes layer in the channel region, the source electrode contact region, and the drain electrode contact region with the polymer material thereby forming a polymer carbon nanotubes composite layer; and removing the photoresist layer and the polymer material in the channel region by a lift-off method. For example, the photoresist layer and the polymer material in the channel region may be removed using a lift-off solvent. Examples of appropriate lift-off solvent include, but are not limited to, N-methylpyrrolidone (NMP).

In some embodiments, the method further includes forming gate electrode layer, and forming a gate insulating layer between the active layer and the gate electrode layer. The thin film transistor may be a top-gate type thin film transistor. Optionally, the thin film transistor is a bottom-gate type thin film transistor. Optionally, the method includes forming a gate electrode on the base substrate; forming a gate insulating layer on a side of the gate electrode distal to the base substrate; forming an active layer on a side of the gate insulating layer distal to the gate electrode; and forming a source electrode and a drain electrode on a side of the active layer distal to the gate insulating layer. Optionally, the thin film transistor is a top-gate type thin film transistor. Optionally, the method includes forming an active layer on a base substrate; forming a source electrode and a drain electrode on a side of the active layer distal to the base substrate; forming a gate insulating layer on a side of the source electrode, the drain electrode, and the active layer, distal to the base substrate; and forming a gate electrode on a side of the gate insulating layer distal to the active layer.

In another aspect, the present disclosure provides a thin film transistor fabricated by a method described herein.

In another aspect, the present disclosure provides a display panel having a thin film transistor described herein or fabricated by a method described herein.

In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

In another aspect, the present disclosure provides an electronic apparatus having a thin film transistor described herein or fabricated by a method described herein.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating an active layer of a thin film transistor having a first portion corresponding to a channel region, a second portion corresponding to a source electrode contact region, and a third portion corresponding to a drain electrode contact region, comprising:
   forming a carbon nanotubes layer in the channel region, the source electrode contact region, and the drain electrode contact region on the base substrate;
   coating the carbon nanotubes layer in the channel region, the source electrode contact region, and the drain electrode contact region with a polymer material thereby forming a polymer carbon nanotubes composite layer; and
   removing the polymer material in the channel region;
   wherein the second portion and the third portion comprise a polymer carbon nanotubes composite including a polymer and a carbon nanotubes material.

2. The method of claim 1, wherein the step of forming the second portion and the third portion comprises:
   forming a carbon nanotubes layer in the source electrode contact region and the drain electrode contact region on a base substrate; and
   coating the carbon nanotubes layer in the source electrode contact region and the drain electrode contact region with a polymer material thereby forming the second portion and the third portion comprising a polymer carbon nanotubes composite.

3. The method of claim 2, wherein the step of coating comprises coating the carbon nanotubes layer in the source electrode contact region and the drain electrode contact region with a polymer ink.

4. The method of claim 2, wherein the step of coating comprises coating the carbon nanotubes layer in the source electrode contact region and the drain electrode contact region with a melted polymer material.

5. The method of claim 1, wherein the step of removing the polymer material in the channel region comprises:
   forming a photoresist layer on a side of the polymer carbon nanotubes composite layer distal to the base substrate;
   exposing the photoresist layer with a mask plate, and developing the exposed photoresist layer to obtain a photoresist pattern having a first section corresponding to the channel region, and a second section corresponding to the source electrode contact region and the drain electrode contact region; the photoresist layer being removed in the first section; and
   removing the polymer material in the channel region thereby forming the first portion.

6. The method of claim 1, prior to the step of coating and subsequent to the step of forming the carbon nanotubes layer, further comprising:
   forming a photoresist layer in the channel region;
   subsequent to the step of coating, the method further comprising:
   removing the photoresist layer and the polymer material in the channel region by a lift-off method using a lift-off solvent.

7. A method of fabricating a thin film transistor, comprising:
   forming the active layer according to a method of claim 1;
   forming a source electrode in the source electrode contact region in direct contact with the second portion; and
   forming a drain electrode in the drain electrode contact region in direct contact with the third portion.

8. A thin film transistor, fabricated by a method of claim 7.

9. A display apparatus, comprising the thin film transistor of claim 8.

* * * * *